United States Patent
Yoshioka

(10) Patent No.: US 9,411,045 B2
(45) Date of Patent: Aug. 9, 2016

(54) GAIN CONTROL CIRCUIT AND ULTRASONIC IMAGE DEVICE

(71) Applicant: FUJITSU LIMITED, Kawasaki-shi, Kanagawa (JP)

(72) Inventor: Masato Yoshioka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 250 days.

(21) Appl. No.: 14/189,825

(22) Filed: Feb. 25, 2014

(65) Prior Publication Data

US 2014/0293738 A1  Oct. 2, 2014

(30) Foreign Application Priority Data

Apr. 2, 2013  (JP) ................. 2013-077042

(51) Int. Cl.
| | |
|---|---|
| G01V 1/16 | (2006.01) |
| G01S 15/02 | (2006.01) |
| H03F 3/193 | (2006.01) |
| H03F 3/45 | (2006.01) |
| G01S 7/52 | (2006.01) |

(52) U.S. Cl.
CPC ............. *G01S 15/02* (2013.01); *G01S 7/52033* (2013.01); *H03F 3/193* (2013.01); *H03F 3/45475* (2013.01); *H03F 2200/294* (2013.01); *H03F 2203/45522* (2013.01); *H03F 2203/45528* (2013.01); *H03F 2203/45591* (2013.01); *H03F 2203/45594* (2013.01)

(58) Field of Classification Search
CPC ....... H03F 1/0227; H03F 1/0216; G01S 7/52; G01S 7/52033
USPC ........................................................... 367/188
See application file for complete search history.

(56) References Cited

U.S. PATENT DOCUMENTS

| | | | | |
|---|---|---|---|---|
| 6,031,421 | A | * | 2/2000 | McEwan ................ G01S 7/34 330/10 |
| 6,563,383 | B1 | | 5/2003 | Otaka et al. |

FOREIGN PATENT DOCUMENTS

| | | |
|---|---|---|
| JP | 57-144476 A | 9/1982 |
| JP | 2001-196880 A | 7/2001 |
| JP | 2002-185341 A | 6/2002 |

\* cited by examiner

*Primary Examiner* — Mark Hellner
(74) *Attorney, Agent, or Firm* — Arent Fox LLP

(57) ABSTRACT

A gain control circuit includes: a voltage generation circuit that generates first voltage that is linearly changed over time; a voltage square circuit that outputs second voltage that is obtained by squaring the first voltage generated by the voltage generation circuit; a resistance circuit that has a resistance characteristic by which a resistance value is squared-changed over time depending on the second voltage output from the voltage square circuit; and a gain adjustment circuit in which gain is squared-changed over time depending on the resistance value of the resistance circuit.

6 Claims, 10 Drawing Sheets

$V_{ct1} = (I_b/C)t$ $I_p = I_0 + \beta V_{ct1}^2$
$= I_0 + \beta(I_b/C)^2 t^2$ $R_{on} = 1/\gamma V_{ct2}$
$= 1/\gamma\{RI_0 + R\beta(I_b/C)^2 t^2\}$ $V_{ct2} = RI_p$
$= RI_0 + R\beta(I_b/C)^2 t^2$ $A = RR_L/R_{on}$
$= RR_L\{I_0 + \beta(I_b/C)^2 t^2\}\gamma/\gamma$

GAIN CONTROL CIRCUIT AND ULTRASONIC IMAGE DEVICE

CROSS-REFERENCE TO RELATED APPLICATION

This application is based upon and claims the benefit of priority of the prior Japanese Patent Application No. 2013-077042, filed on Apr. 2, 2013, the entire contents of which are incorporated herein by reference.

FIELD

The embodiments discussed herein are related to a gain control circuit and an ultrasonic image device.

BACKGROUND

In the related art, there is a radio transmission device that transmits data continuously and includes a step gain control unit that switches the gain in upward steps or downward steps and allows gain to be controlled continuously in the switching process.

Such a radio transmission device further includes a memory and a continuous gain control unit that allows gain to be controlled continuously at least while switching of gain is performed in the step gain control unit.

Such a memory includes a first table storing a relationship between control voltage and gain of the step gain control unit, and a second table storing a relationship between control voltage and gain of the continuous gain control unit.

In addition, such a memory further includes a third table storing a control voltage time profile in the gain switching process of the step gain control unit, and a fourth table storing a control voltage time profile of the continuous gain control unit in the gain switching process of the step gain control unit.

In addition, such a radio transmission device further includes a control processing unit that controls instructed transmission power by outputting the control voltage of the step gain control unit and the control voltage of the continuous gain control unit in accordance with the transmission power with reference to the first to fourth tables.

Japanese Laid-open Patent Publication No. 2002-185341 is the related art, for example.

The scale of the circuit in the radio transmission device in the related art is large because the radio transmission device includes the step gain control unit, the memory, and the like in order to control the gain.

SUMMARY

According to an aspect of the embodiments, a gain control circuit includes: a voltage generation circuit that generates first voltage that is linearly changed over time; a voltage square circuit that outputs second voltage that is obtained by squaring the first voltage generated by the voltage generation circuit; a resistance circuit that has a resistance characteristic by which a resistance value is squared-changed over time depending on the second voltage output from the voltage square circuit; and a gain adjustment circuit in which gain is squared-changed over time depending on the resistance value of the resistance circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A gain control circuit and an ultrasonic image device according to an embodiment are described below, and gain control circuits and ultrasonic image devices according to the embodiments are described later.

Figure 1:
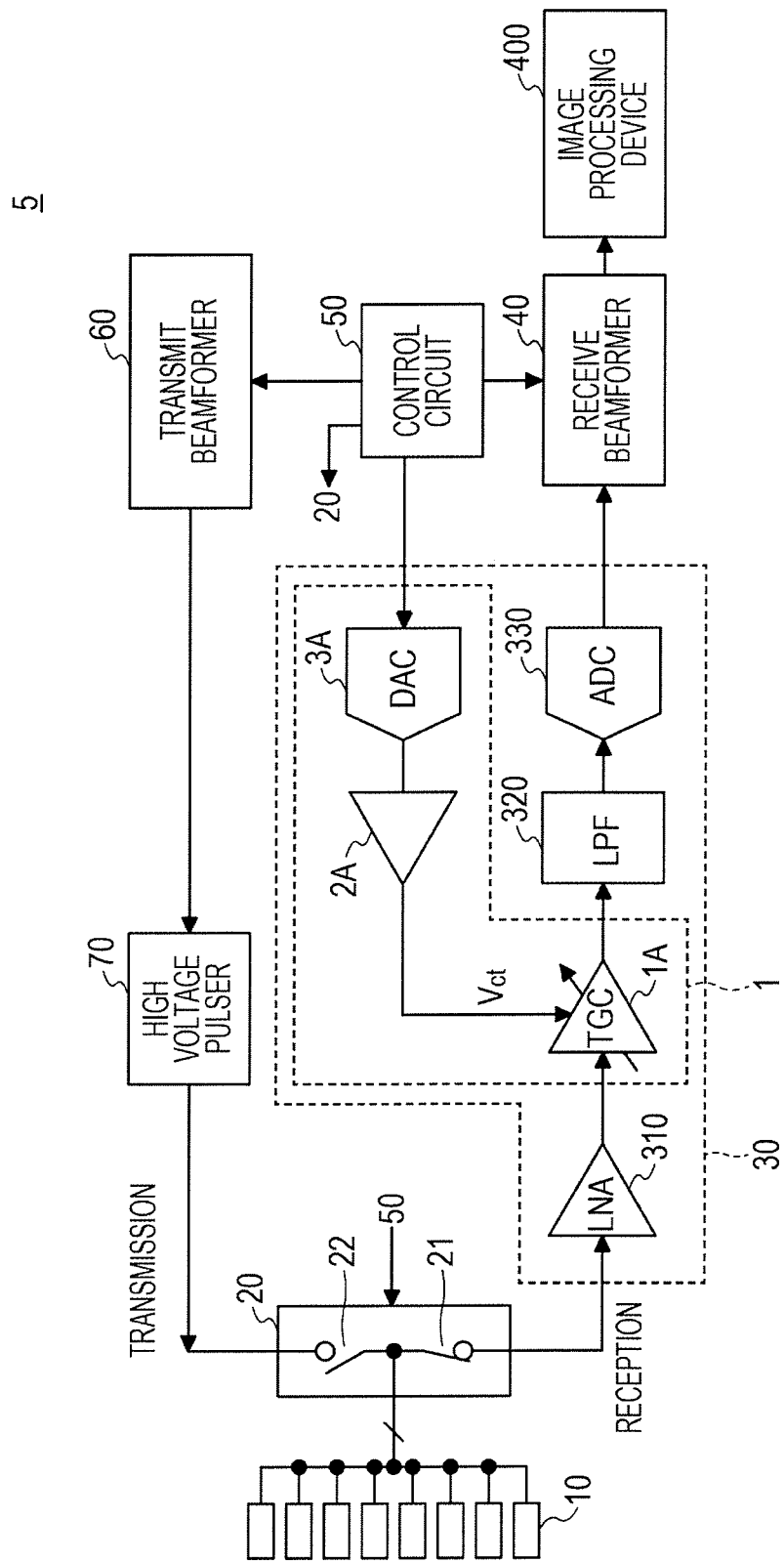
FIG. 1 is a diagram illustrating an ultrasonic image device that includes a gain control circuit 1.
Figure 2A:
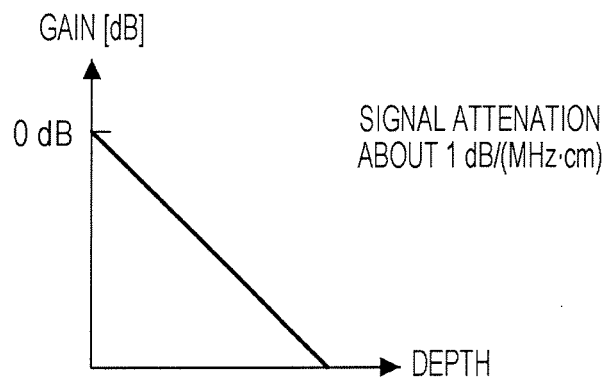
FIG. 2A is a diagram illustrating an attenuation characteristic of ultrasonic waves propagating in a living body.
Figure 2B:
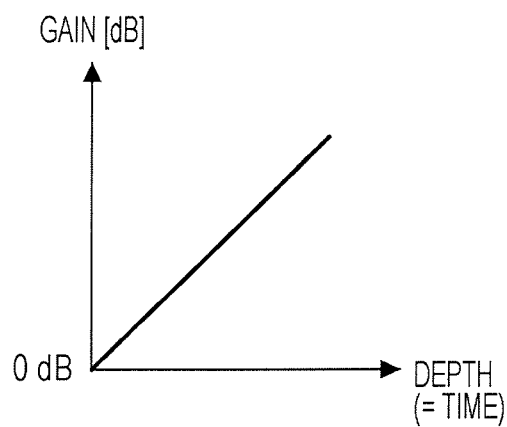
FIG. 2B is a diagram illustrating a time gain control characteristic of the gain control circuit.

FIG. 1 is a diagram illustrating the ultrasonic image device 5 that includes the gain control circuit 1. FIG. 2A is a diagram illustrating an attenuation characteristic of ultrasonic waves propagating in a living body, and FIG. 2B is a diagram illustrating a time gain control characteristic of the gain control circuit 1.

The ultrasonic image device 5 includes a transducer 10, a switch 20, an analog front end (AFE) 30, a receive beamformer 40, a control circuit 50, a transmit beamformer 60, a high voltage puller 70, and an image processing device 400.

In FIG. 1, a set of the transducer 10, the switch 20, and the AFE 30 is illustrated, but in the actual ultrasonic image device 5, a plurality of sets of the transducer 10, the switch 20, and the AFE 30 is arranged.

In addition, in the ultrasonic image device 5, for example, the transducer 10, the AFE 30, the receive beamformer 40, the control circuit 50, the transmit beamformer 60, and the image processing device 400 may be provided as a semiconductor device or a semiconductor integrated circuit that is manufactured by a semiconductor manufacturing technology.

The transducer 10 is a device that performs conversion between voltage and ultrasonic waves. The transducer 10 converts pulse voltage received from the high voltage pulser 70 through the switch 20 into ultrasonic waves and outputs the converted ultrasonic waves. In addition, the transducer 10 converts ultrasonic waves reflected by a target object into voltage and outputs the converted voltage to the switch 20.

The reflected waves correspond to echo that is obtained when the ultrasonic waves from the transducer 10 are reflected by the target object and the reflected ultrasonic waves return to the transducer 10. In addition, the target object is, for example, a living body, typically, a human body.

The switch 20 is a three-terminal switch, and is connected between the transducer 10, the AFE 30, and the high voltage pulser 70. The switch 20 includes switch units 21 and 22. The switching of on/off of the switch units 21 and 22 in the switch 20 is performed by the control circuit 50.

The switch unit 21 switches the connection state of the switch 20 between the transducer 10 and the AFE 30. The switch unit 22 switches the connection state of the switch 20 between the transducer 10 and the high voltage pulser 70. The switch 20 switches a connection destination of the transducer 10 to the AFE 30 or the high voltage pulser 70 by switching on/off of the switch units 21 and 22.

When the ultrasonic image device 5 transmits ultrasonic waves to the target object, the switch 20 connects the transducer 10 with the high voltage pulser 70 by turning the switch unit 21 off and turning the switch unit 22 on.

In addition, when the ultrasonic image device 5 receives reflected waves (echo), the switch 20 connects the transducer 10 with the AFE 30 by turning the switch unit 21 on and turning the switch unit 22 off.

The switch 20 is on a path through which pulsed high voltage (for example, about 100 V) is supplied from the high voltage pulser 70 to the transducer 10, so that it is desirable that the switch 20 has a structure in which high voltage is withstood.

As the switch 20, a so-called transmitter/receiver (Tx/Rx) switch that performs switching between transmission equipment (transmitter) and receiving equipment (receiver) may be employed. For example, the Tx/Rx switch may use a diode bridge, or may switch the connection mechanically.

The AFE 30 is connected between the switch unit 21 of the switch 20 and the receive beamformer 40. The AFE 30 includes a low noise amplifier (LNA) 310, the gain control circuit 1, a low pass filter (LPF) 320, and an analog/digital converter (ADC) 330.

The LNA 310 amplifies the reflected waves received from the transducer 10 through the switch 20. The reflected waves are attenuated as compared to the ultrasonic waves from the transducer 10, so that the LNA 310 is provided in order to amplify the reflected waves received by the AFE 30. The reflected waves that have been amplified in the LNA 310 are input to the gain control circuit 1.

The gain control circuit 1 is provided between the LNA 310 and the LPF 320, and controls signal gain of the reflected waves in a time-axis direction. The gain control circuit 1 includes a time gain control/compensation (TGC) amplifier 1A, an amplifier 2A, and a digital/analog converter (DAC) 3A.

A control signal that is used to determine an increase amount by which the gain of the input signal is increased by the gain control circuit 1 is input to the DAC 3A from the control circuit 50. Such a control signal is used to step up a digital code of the DAC 3A over time.

The DAC 3A outputs control voltage that indicates a digital value based on the control signal, and the control voltage is amplified in the amplifier 2A and is input to a control terminal of the TGC amplifier 1A as control voltage $V_{ct}$.

The TGC amplifier 1A controls the signal gain of the reflected waves in the time-axis direction based on the control voltage $V_{ct}$ that is input from the amplifier 2A.

In an operation of the TGC amplifier 1A, the control of signal gain of the reflected waves in the time-axis direction is similar to compensation of the signal gain of the reflected waves in the time-axis direction.

Here, for example, when an image of the inside of the abdomen of the human body is obtained by the ultrasonic image device 5, the ultrasonic waves that output from the transducer 10 are absorbed to the human body, so that the signal gain of the ultrasonic waves is significantly attenuated in the human body. Therefore, the signal gain of the reflected waves is much smaller than the signal gain of the ultrasonic waves output from the transducer 10.

A signal attenuation amount of the ultrasonic signals in the human body is about 1 dB/(MHz·cm). Therefore, as illustrated in FIG. 2A, the signal attenuation amount of the ultrasonic signals in the human body is increased as the depth from the body surface at a location that is monitored by the ultrasonic image device 5 becomes large.

Thus, when an image of the inside of the abdomen of the human body is obtained in the ultrasonic image device 5, the depth of the monitored location is proportional to a time until ultrasonic waves are reflected at the monitor location and are detected in the transducer 10 after the ultrasonic waves are output from the transducer 10. This is why a distance of twice the depth corresponds to a propagation distance of the ultrasonic waves when the transducer 10 is applied to the surface of the human body.

Therefore, as illustrated in FIG. 2B, the TGC amplifier 1A has a linear time gain control characteristic that is used to control the signal gain of the reflected waves in accordance with the time that is proportional to the depth. Such a linear time gain control characteristic is obtained by stepping up a digital code of the DAC 3A that is operated by a control signal received from the control circuit 50.

The LPF 320 is provided between the TGC amplifier 1A and the ADC 330. The LPF 320 suppresses noise components with high frequencies from the reflected waves that are amplified in the TGC amplifier 1A and outputs the obtained reflected waves to the ADC 330.

The ADC 330 is connected to the output side of the LPF 320, that is, the output stage of the AFE 30. The ADC 330 converts the reflected waves received from the LPF 320 into digital signals and outputs the obtained digital signals to the receive beamformer 40.

The receive beamformer 40 converts the digital signals that are output from the ADC 330 of the AFE 30 into display image frame signals and performs output of the obtained signals.

The control circuit 50 controls the switch 20, the receive beamformer 40, the DAC 3A, and the transmit beamformer 60.

The control circuit 50 performs switching control of on/off of the switch units 21 and 22 in the switch 20. In addition, the control circuit 50 controls the receive beamformer 40 to convert digital signals into display image frame signals and output the converted signals to the receive beamformer 40.

In addition, the control circuit 50 inputs, to the DAC 3A, a control signal that is used to determine an increase amount by which gain of the input signal is increased by the gain control circuit 1. Such a control signal is a signal that causes the digital code of the DAC 3A to be stepped up over time.

In addition, the control circuit 50 performs drive control on the transmit beamformer 60. The drive control of the transmit beamformer 60 by the control circuit 50 corresponds to control that is performed so as to generate a drive signal that is used to drive the high voltage pulser 70 so that ultrasonic waves are output, in order, from a plurality of conversion units of the transducer 10, which are arranged in an array.

The high voltage pulser 70 performs output of pulsed high voltage depending on a drive pattern that is input from the transmit beamformer 60. The pulsed high voltage is converted into ultrasonic waves in the transducer 10 through the switch 20, and the ultrasonic waves are output, in order, from the plurality of conversion units of the transducer 10, which are arranged in an array.

In such an ultrasonic image device 5, when the control circuit 50 performs drive control on the transmit beamformer 60, the ultrasonic waves are output from the transducer 10 by the pulsed high voltage that is output from the high voltage pulser 70.

In addition, in the ultrasonic image device 5, the ultrasonic waves reflected by the target object are received at the transducer 10, and the signal gain of the reflected waves is controlled in the AFE 30, and the obtained digital signals are output to the receive beamformer 40. The receive beamformer 40 converts the digital signals that are output from the AFE 30 into display image frame signals and outputs the obtained signals to the image processing device 400.

The image processing device 400 generates image signals that indicate an image of the target object based on the display image frame signals received from the receive beamformer 40. The image signals that are generated by the image processing device 400 are displayed on a liquid crystal monitor or the like.

The gain control circuit 1 includes the amplifier 2A and the DAC 3A, so that the size of the gain control circuit 1 becomes relatively large. For example, the DAC 3A includes a capacitor that corresponds to multiple bit portion as a conversion stage because the DAC 3A converts analog signals received from the control circuit 50 into digital signals.

Therefore, it is difficult to downsize the gain control circuit 1, which may cause an increase in power consumption, an increase in manufacturing cost, and the like when the gain control circuit 1 is provided as a semiconductor device.

Figure 3:
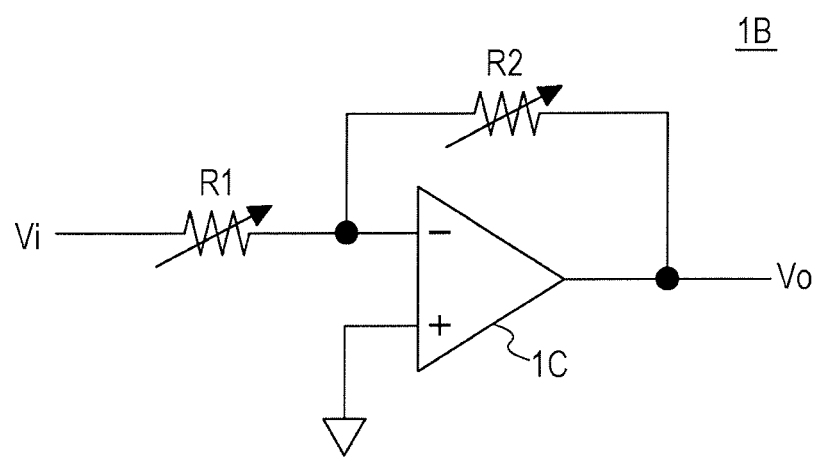
FIG. 3 is a diagram illustrating an example of a time gain control/compensation (TGC) amplifier.

In addition, as the TGC amplifier 1A of the gain control circuit 1, for example, a negative feedback amplifier in which an operational amplifier as illustrated in FIG. 3 is used may be employed. FIG. 3 is a diagram illustrating an example of the TGC amplifier 1A.

An amplifier 1B illustrated in FIG. 3 is an inverting amplification circuit in which an operational amplifier 1C is used, and gain A is set as a ratio of an input resistor R1 to an feedback resistor R2 (A=R2/R1). As the input resistor R1 and the feedback resistor R2, a variable resistor is employed.

The variable resistor is used, for example, to change a combined resistance value by connecting a plurality of sets of a resistor and a switch each other in parallel, and changing the number of resistors that are connected to each other in parallel through switching of the switch.

However, the gain A is determined by the ratio of the resistance value of the input resistor R1 to the resistance value of the feedback resistor R2, so that in the TGC amplifier 1A in which the above-described variable resistor is used for the input resistor R1 and the feedback resistor R2, the gain A corresponds to a discrete value that is changed in upward steps or downward steps, and for example, as illustrated in FIG. 2B, it is difficult to obtain a linear gain characteristic.

In addition, as the gain becomes large (for example, 30 dB or more), the value exceeds the limit of an amplification factor of the operational amplifier, so that it is difficult to obtain a time gain control characteristic of the gain control circuit 1 by the amplifier 1B in which the operational amplifier 1C of one stage is used.

Figure 4:
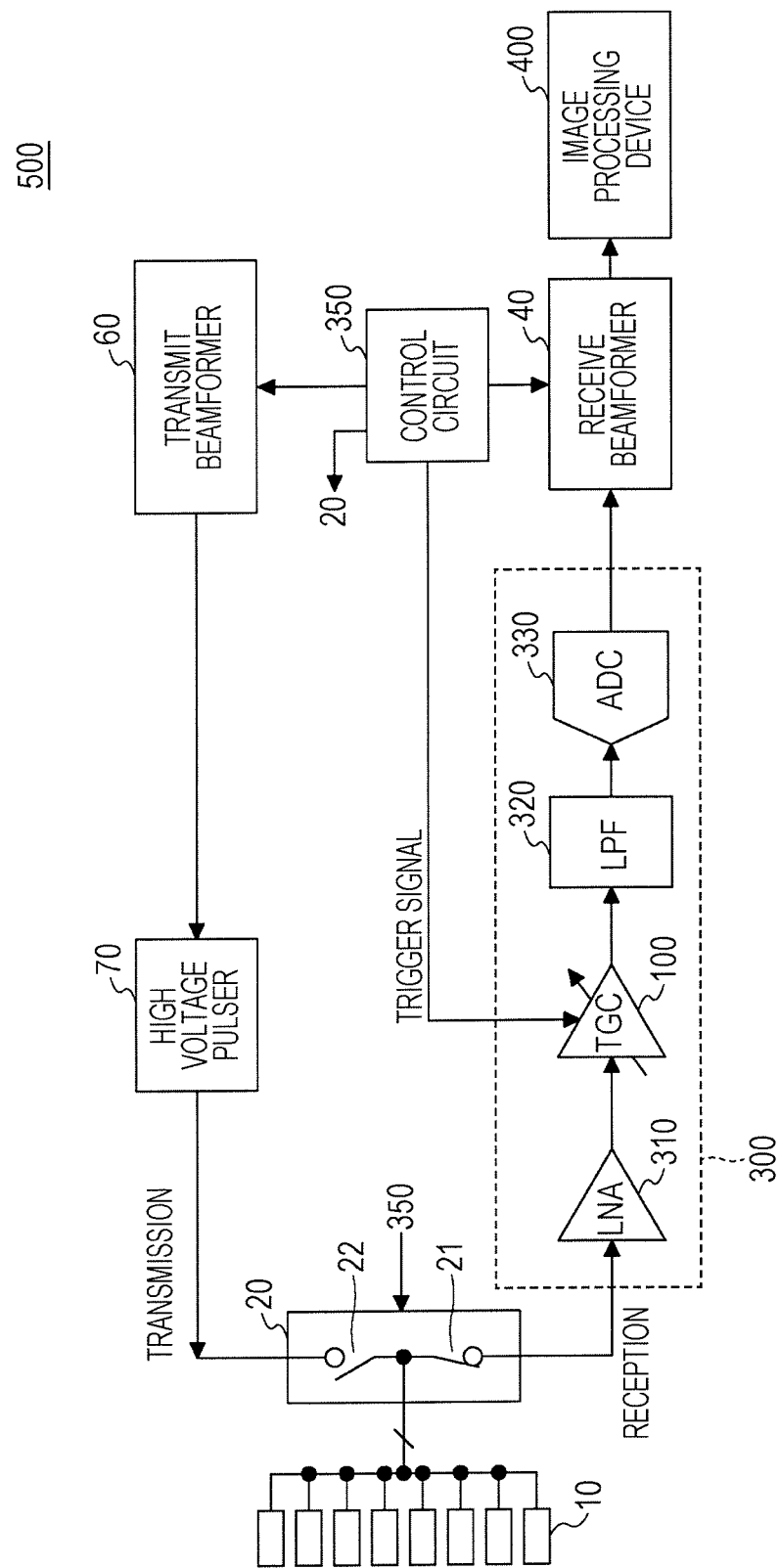
FIG. 4 is a diagram illustrating an ultrasonic image device that includes a gain control circuit.
Figure 5A:
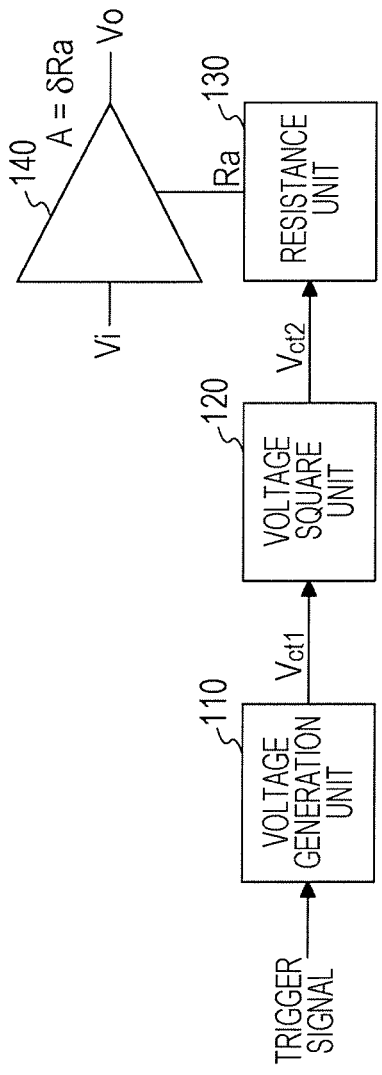
FIG. 5A is a diagram illustrating a configuration of the gain control circuit.
Figure 5D:
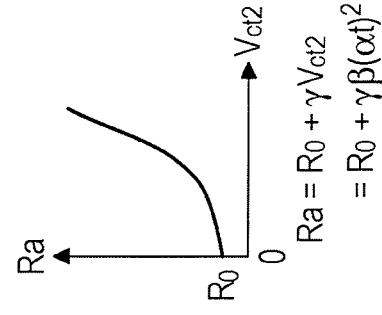
FIGS. 5B, 5C, and 5D are diagrams illustrating the time gain control characteristics.
Figure 5C:
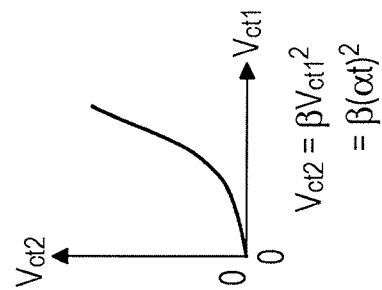
Figure 5B:
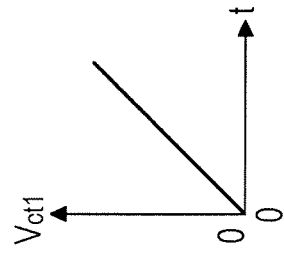

FIG. 4 is a diagram illustrating the ultrasonic image device 500 that includes the gain control circuit 100. FIG. 5A is a diagram illustrating a configuration of the gain control circuit 100, and FIGS. 5B, 5C, and 5D are diagrams illustrating time gain control characteristics of the gain control circuit 100.

In the ultrasonic image device 500, the AFE 30 and the control circuit 50 in the ultrasonic image device 5 (see FIG. 1) are respectively replaced with the AFE 300 and the control circuit 350. The other configuration elements are similar to the configuration elements in the ultrasonic image device 5 as the base technology, so that the same reference numerals are assigned to the similar configuration elements, and the description is omitted herein.

The ultrasonic image device 500 includes the transducer 10, the switch 20, the AFE 300, the receive beamformer 40, the control circuit 350, the transmit beamformer 60, the high voltage pulser 70, and the image processing device 400.

In FIG. 4, a set of the transducer 10 and the AFE 300 is illustrated, but a plurality of sets of the transducer 10 and the AFE 300 are provided in the actual ultrasonic image device 500.

In the ultrasonic image device 500, the switch 20 is connected between the transducer 10, the AFE 300, and the high voltage pulser 70. When the ultrasonic image device 500 receives reflected waves (echo), the switch 20 connects the transducer 10 and the AFE 300 by turning the switch unit 21 on and turning the switch unit 22 off.

The AFE 300 is connected between the switch unit 21 of the switch 20 and the receive beamformer 40. The AFE 300 includes the LNA 310, the gain control circuit 100, the LPF 320, and the ADC 330. In the AFE 300, the TGC amplifier 1A of the AFE 30 illustrated in FIG. 1 is replaced with the gain control circuit 100, and the other configuration elements are similar to the configuration elements of the AFE 30.

The gain control circuit 100 is provided between the LNA 310 and the LPF 320, and corresponds to a TGC gain control circuit that controls the signal gain of the reflected waves in the time-axis direction. Here, the control of the signal gain of the reflected waves in the time-axis direction corresponds to compensation of the signal gain of the reflected waves in the time-axis direction.

The gain control circuit 100 includes a time gain control characteristic that is used to compensate the signal gains of the reflected waves depending on a time that is proportional to the depth. The time gain control characteristic of the gain control circuit 100 is described later with reference to FIG. 7.

The LPF 320 is provided between the gain control circuit 100 and the ADC 330. The LPF 320 suppresses noise components with high frequencies from the reflected waves that are amplified in the gain control circuit 100, and outputs the obtained reflected waves to the ADC 330.

The ADC 330 is connected to the output side of the LPF 320, that is, the output stage of the AFE 300. The ADC 330 converts the reflected waves received from the LPF 320 into digital signals and outputs the obtained digital signals to the receive beamformer 40.

The receive beamformer 40 converts the digital signals that are output from the ADC 330 of the AFE 300 into display image frame signals and, performs output of the obtained signals.

The control circuit 350 controls the receive beamformer 40, the AFE 300, and the transmit beamformer 60. The control circuit 350 is similar to the control circuit 50 except that the control circuit 350 input a trigger signal to the AFE 300.

FIG. 5A illustrates the configuration of the gain control circuit 100, and FIGS. 5B, 5C, and 5D illustrate a time characteristic of voltage or resistance in each of the units.

As illustrated in FIG. 5A, the gain control circuit 100 includes a voltage generation unit 110, a voltage square unit 120, a resistance unit 130, and an amplification unit 140.

The voltage generation unit 110 is an example of a voltage generation unit that generates voltage $V_{ct1}$ that is changed linearly over time. The voltage generation unit 110 starts to generate the voltage $V_{ct1}$ when a trigger signal is input from the control circuit 350 (see FIG. 4).

For example, as illustrated in FIG. 5B, the voltage $V_{ct1}$ that is generated by the voltage generation unit 110 is linearly increased over time t. The voltage $V_{ct1}$ illustrated in FIG. 5B is represented by the following formula (1).

$$V_{ct1} = \alpha t \quad (1)$$

Here, α represents a time change rate (α≠0) of the voltage $V_{ct1}$ that is output from the voltage generation unit 110.

The voltage $V_{ct1}$ may be decreased linearly with the time t as long as the voltage generation unit 110 generates the voltage $V_{ct}$ that is changed linearly over time.

The voltage square unit 120 is an example of a voltage square unit that performs output of voltage $V_{ct2}$ that is obtained by squaring the voltage $V_{ct1}$ that is generated by the voltage generation unit 110. For example, as illustrated in FIG. 5C, the voltage $V_{ct2}$ that is generated by the voltage square unit 120 is quadratically increased with the time t. Such a quadratic function is obtained by squaring the voltage $V_{ct1}$.

The voltage $V_{ct2}$ illustrated in FIG. 5C is represented by the following formula (2).

$$V_{ct2} = \beta V_{ct1}^2 = \beta(\alpha t)^2 \quad (2)$$

Here, β represents a coefficient (β≠0) when the voltage $V_{ct1}$ is squared in the voltage square unit 120.

The resistance unit 130 is an example of a resistance unit that has a resistance value that is changed depending on the voltage $V_{ct2}$ that is output from the voltage square unit 120. The resistance value of the resistance unit 130 is changed depending on the voltage $V_{ct2}$, and has a characteristic the value of which is quadratically increased over time. A resistance value Ra of the resistance unit 130 is input to the amplification unit 140.

The resistance value Ra illustrated in FIG. 5D is represented by the following formula (3).

$$Ra = R_0 + \gamma V_{ct2} = R_0 + \gamma \beta(\alpha t)^2 \quad (3)$$

Here, γ represents a coefficient (γ≠0) when the resistance value of the resistance unit 130 is changed.

The amplification unit 140 is an example of a gain adjustment unit in which the gain is quadratically changed over time depending on a resistance value of the resistance unit 130. The amplification unit 140 amplifies input voltage Vi and performs output of the amplified voltage Vi as output voltage Vo. The output voltage Vo is output of the gain control circuit 100.

The gain A of the amplification unit 140 is represented by "A=δRa". Therefore, the gain A is represented by the following formula (4).

$$A = \delta R_0 + \gamma \beta \delta(\alpha t)^2 \quad (4)$$

Here, δ represents a coefficient (δ≠0) that is included in the gain A of the amplification unit 140. The gain A of the amplification unit 140 is quadratically changed depending on a resistance value Ra of the resistance unit 130.

The gain A of the amplification unit 140 is quadratically changed because the gain A is a value based on the resistance value Ra of the resistance unit 130, and the resistance value Ra is changed depending on the voltage $V_{ct2}$ that is obtained by squaring the voltage $V_{ct1}$ that is generated by the voltage generation unit 110.

As illustrated in FIGS. 5A, 5B, 5C, and 5D, the gain control circuit 100 generates the voltage $V_{ct2}$ by squaring, in the voltage square unit 120, the voltage $V_{ct1}$ that is generated by the voltage generation unit 110 and linearly changed.

In addition, the gain control circuit 100 generates a resistance value Ra that has a characteristic the value of which is quadratically increased over time based on the voltage $V_{ct2}$ in the resistance unit 130 and performs output of the generated resistance value, and the amplification unit 140 controls gain of the input voltage Vi by the gain A that is quadratically changed depending on the resistance value Ra.

Thus, the output voltage Vo of the gain control circuit 100 has a time gain control characteristic the value of which is quadratically changed over time based on the voltage $V_{ct2}$ that is obtained by squaring the voltage $V_{ct1}$ that is generated by the voltage generation unit 110.

Here, the gain A of the amplification unit 140 of the gain control circuit 100 is quadratic functional gain that is generated based on the voltage $V_{ct2}$ that is obtained by squaring the voltage $V_{ct1}$ that is generated by the voltage generation unit 110, so that, log 2 (A) is not proportional to log 10 (t) to be exact.

However, the log 2 (A) may be proportional to the log 10 (t) at least in some sections by adjusting the coefficients α, β, γ, and δ of the voltage generation unit 110, the voltage square unit 120, the resistance unit 130, and the amplification unit 140.

The gain control circuit 100 may obtain a log-linear characteristic of the output voltage Vo by adjusting the coefficients as described above.

The detailed circuit configuration example of the gain control circuit 100 is described below with reference to FIG. 6A.

Figure 6A:
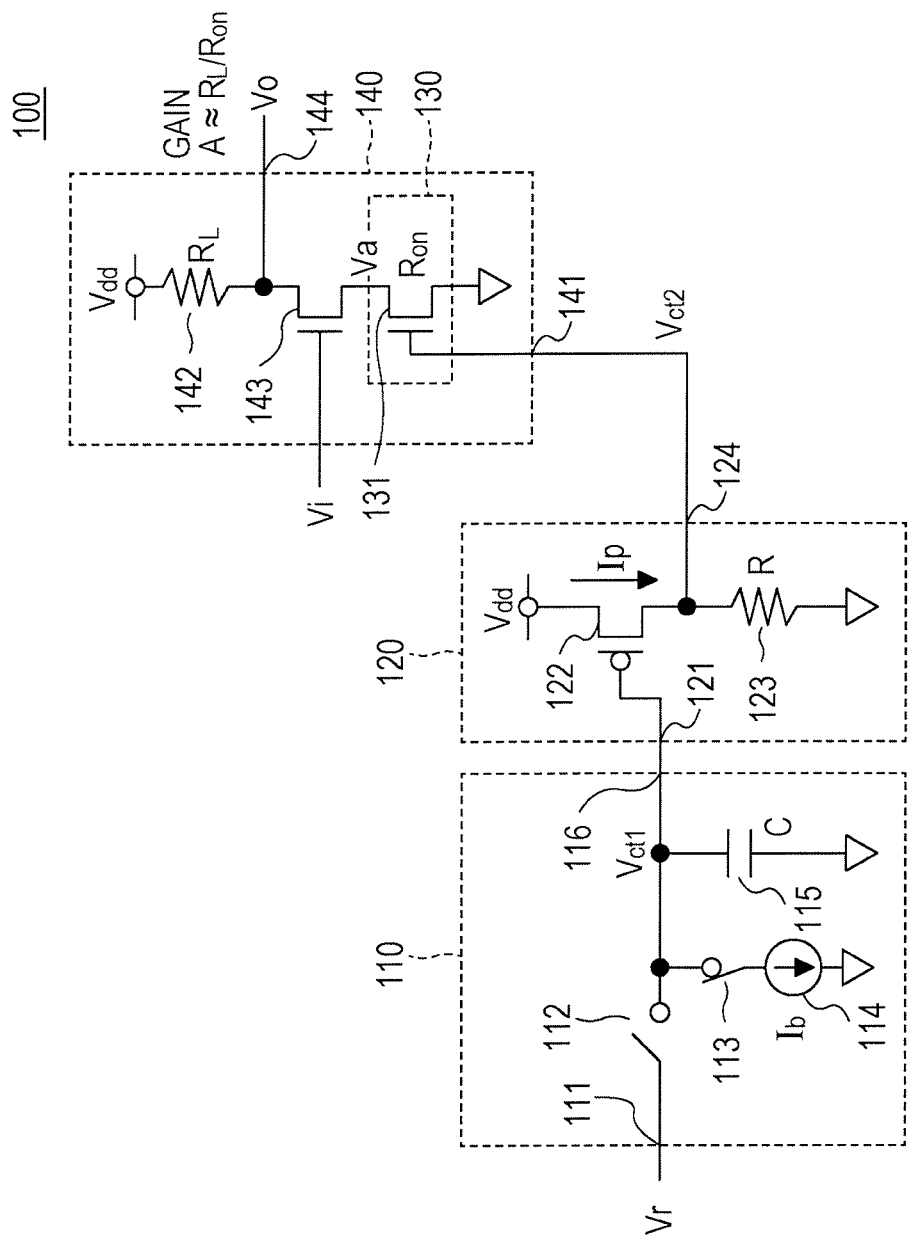
FIG. 6A is a diagram illustrating a circuit configuration example of the gain control circuit.

FIG. 6A is a diagram illustrating the circuit configuration example of the gain control circuit 100 and FIGS. 6B to 6F are diagrams illustrating time characteristics of voltage or resistance in each of the units. In FIG. 6A, an example of the concrete circuit configurations of the voltage generation unit 110, the voltage square unit 120, the resistance unit 130, and the amplification unit 140 illustrated in FIG. 5A is illustrated. In addition, in FIGS. 6B to 6F, the time characteristic of voltage or resistance in each of the units are illustrated.

As illustrated in FIG. 6A, the voltage generation unit 110 includes an input section 111, switches 112 and 113, a current source 114, a capacitor 115, and an output section 116.

Reference voltage Vr is input to the input section 111. The reference voltage Vr is an initial value of the output voltage of the voltage generation unit 110. The switch 112 is connected to the input section 111.

The switch 112 is inserted between the input section 111 and the output section 116 so as to be connected to the input section 111 and the output section 116 in series. The switching of the switch 112 is performed based on a trigger signal received from the control circuit 350 (see FIG. 4). The switch 112 is turned on when the output voltage of the voltage generation unit 110 is reset to the initial value Vr, and turned off after the reset.

One end of the switch 113 (terminal on the upper side in FIG. 6A) is connected between the switch 112 and the output section 116, and the other end of the switch 113 (terminal on the lower side in FIG. 6A) is connected to an input section of the current source 114 (terminal on the upper side in FIG. 6A). The switching of the switch 113 is performed based on the trigger signal received from the control circuit 350 (see FIG. 4). The switch 113 is turned off when the output voltage of the voltage generation unit 110 is reset to the initial value Vr, and is turned on after the reset.

The input section of the current source 114 (terminal on the upper side in FIG. 6A) is connected to the switch 113, and the output section of the current source 114 (terminal on the lower side in FIG. 6A) is grounded. A current value that is output from the current source 114 is represented as $I_b$. The current $I_b$ is used as discharge current that is used to discharge the capacitor 115.

One end of the capacitor 115 (terminal on the upper side in FIG. 6A) is connected between the switch 112 and the output section 116, and the other end of the capacitor 115 (terminal on the lower side in FIG. 6A) is grounded. The capacitor 115 is connected between the input section 111 and the output section 116 so as to be parallel to the switch 113 and the current source 114. The capacitance of the capacitor 115 is represented as C.

The output section 116 is connected to the switches 112 and 113, and the capacitor 115 in the voltage generation unit 110, and connected to an input section 121 of the voltage square unit 120 outside the voltage generation unit 110.

The input section 111 and the output section 116 respectively correspond to a signal input section and a signal output section of the voltage generation unit 110. Here, the voltage generation unit 110 includes the input section 111 and the output section 116, but the input section 111 and the output section 116 may be respectively regarded as an input terminal and an output terminal.

The voltage square unit 120 includes the input section 121, a p-type metal oxide semiconductor field effect transistor (PMOSFET) 122, a resistor 123, and an output section 124.

The input section 121 corresponds to an input section of the voltage square unit 120. The input section 121 is connected to the output section 116 of the voltage generation unit 110 and the gate of the PMOSFET 122.

The source of the PMOSFET 122 is connected to a power source $V_{dd}$, the gate of the PMOSFET 122 is connected to the input section 121, and the drain of the PMOSFET 122 is connected to the resistor 123 and the output section 124. The PMOSFET 122 is driven by the output voltage of the voltage generation unit 110.

The PMOSFET 122 is driven in a saturation region in order to obtain the voltage $V_{ct2}$ that is obtained by squaring the voltage $V_{ct1}$ that is input to the gate of the PMOSFET 122. The condition under which the PMOSFET 122 is operated in the saturation region is described later.

One end of the resistor 123 (terminal on the upper side in FIG. 6A) is connected to the drain of the PMOSFET 122 and the output section 124, and the other end of the resistor 123 (terminal on the lower side in FIG. 6A) is grounded.

The output section 124 is connected to the drain of the PMOSFET 122, the resistor 123, and an input section 141 of the amplification unit 140.

The input section 121 and the output section 124 respectively correspond to a signal input section and a signal output section of the voltage square unit 120. Here, the voltage square unit 120 includes the input section 121 and the output section 124, but the input section 121 and the output section 124 may be respectively regarded as an input terminal and an output terminal.

In the circuit configuration illustrated in FIG. 6A, the resistance unit 130 is included in the amplification unit 140. The resistance unit 130 includes an n-type metal oxide semiconductor field effect transistor (NMOSFET) 131. The gate of the NMOSFET 131 is connected to the input section 141 of the amplification unit 140, and the drain of the NMOSFET 131 is connected to the source of a NMOSFET 143, the source of the NMOSFET 131 is grounded.

The amplification unit 140 includes the input section 141, a resistor 142, the NMOSFET 143, and an output section 144. In addition, the amplification unit 140 also includes the resistance unit 130.

The input section 141 is connected to the output section 124 of the voltage square unit 120 and the gate of the NMOSFET 131 of the resistance unit 130.

The resistor 142 is connected between the power source $V_{dd}$ and the drain of the NMOSFET 143. The resistance value of the resistor 142 is represented as $R_L$.

Input voltage Vi is input to the gate of the NMOSFET 143, the drain of the NMOSFET 143 is connected to the resistor 142, and the source of the NMOSFET 143 is connected to the drain of the NMOSFET 131 of the resistance unit 130. That is, the gate of the NMOSFET 143 is connected to the output section of the LNA 310 of the AFE 300 (see FIG. 4). The NMOSFET 143 is operated by the input signal that is input to the gate of the NMOSFET 143.

The output section 144 is connected to the resistor 142 and the drain of the NMOSFET 143. The output section 144 outputs the output voltage Vo of the amplification unit 140. In addition, the output section 144 corresponds to an output section of the gain control circuit 100. Therefore, the output section 144 is connected to the input section of the LPF 320 of the AFE 300.

Such an amplification unit 140 has a so-called source degeneration configuration because the source of the NMOSFET 143 is connected to the drain of the NMOSFET 131 of the resistance unit 130.

Here, when the reciprocal number of the transfer conductance in the NMOSFET 143 is sufficiently larger than on-resistance $R_{on}$ of the NMOSFET 131, the gain A of the amplification unit 140 is represented as a ratio of the resistance value $R_L$ of the resistor 142 to the on-resistance $R_{on}$ of the NMOSFET 131 using the following formula (5).

$$A = R_L/R_{on} = \gamma RR_L I_0 + (\beta\gamma RR_L I_b^2 t^2)/C^2 \qquad (5)$$

That is, the gain A of the gain control circuit 100 illustrated in FIG. 6A is similar to the gain A of the gain control circuit 100 illustrated in FIG. 5A, which is represented using the formula (4).

An operation of the gain control circuit 100 illustrated in FIG. 6A is described below.

Figure 6B:
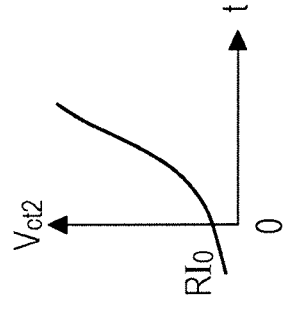
FIGS. 6B, 6C, 6D, 6E, and 6F are diagrams illustrating time characteristics of voltage or resistance in each unit.

In the gain control circuit 110 that has the circuit configuration illustrated in FIG. 6A, when a trigger signal is input to the voltage generation unit 110 from the control circuit 350 (see FIG. 4), as illustrated in FIG. 6B, the output voltage $V_{ct1}$ is linearly decreased after being reset to initial value Vr.

For example, first, voltage between both ends of the capacitor 115 becomes the initial voltage Vr by turning the switch 112 on and turning the switch 113 off, so that the output voltage $V_{ct1}$ is reset to the initial value Vr.

The charge that is accumulated in the capacitor 115 is drawn by current $I_b$ of the current source 114 by turning the switch 112 off and turning the switch 113 on after the output voltage $V_{ct1}$ is reset to the initial value Vr.

As a result, as illustrated in FIG. 6B, the output voltage $V_{ct1}$ is decreased linearly over time. The output voltage $V_{ct1}$ is represented using the following formula (6).

$$V_{ct1} = (I_b/C)t \qquad (6)$$

In addition, in the voltage square unit 120, the PMOSFET 122 is gradually turned on with the decrease in the output voltage $V_{ct1}$ of the voltage generation unit 110, and is operated in the saturation region.

A bias condition under which the PMOSFET 122 is operated in the saturation region is described below.

In order to cause the PMOSFET 122 to operate in the saturation region, it is desirable that drain voltage ($V_{dd} - V_{ct2}$) of the PMOSFET 122 is over-drive voltage ($V_{dd} - V_{ct1} - V_{thp}$)

or more of the PMOSFET 122. Therefore, the bias condition is represented using the following formula (7).

$$V_{dd}-V_{ct1}-V_{thp} \geq V_{dd}-V_{ct2} \quad (7)$$

Here, $V_{thp}$ corresponds to threshold value voltage of the PMOSFET 122.

That is, the PMOSFET 122 may set the bias condition so that an initial state and a voltage range that satisfy the formula (7) are obtained.

Figure 6C:
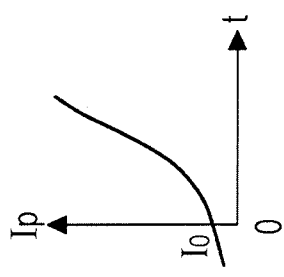

The current Ip that flows between the source and the drain of the PMOSFET 122 of the voltage square unit 120 becomes as illustrated in FIG. 6C and is represented using the following formula (8) by driving the PMOSFET 122 under the above-described bias condition.

$$Ip = I_0 + \beta V_{ct1}^2 = I_0 + \beta(I_b/C)^2 t^2 \quad (8)$$

As described above, the current Ip that flows between the source and the drain of the PMOSFET 122 has a characteristic by which the current Ip is quadratically increased.

Figure 6E:
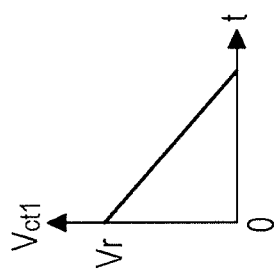
Figure 6D:
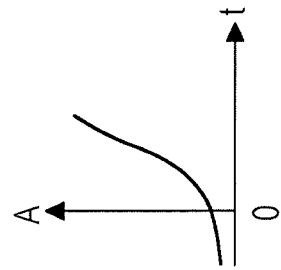

In addition, the output voltage $V_{ct2}$ of the voltage square unit 120 becomes as illustrated in FIG. 6D and is represented using the following formula (9).

$$V_{ct2} = RIp = RI_0 + R\beta V_{ct1}^2 = RI_0 + R\beta(I_b/C)^2 t^2 \quad (9)$$

That is, the output voltage $V_{ct2}$ of the voltage square unit 120 becomes a value that is obtained by squaring the output voltage $V_{ct1}$ that is generated by the voltage generation unit 110. Here, $I_0$ corresponds to an initial value of the current Ip that flows between the source and the drain of the PMOSFET 122.

When the output voltage $V_{ct2}$ of the voltage square unit 120 is input to the gate of the NMOSFET 131 of the resistance unit 130, the NMOSFET 131 is turned on with the increase in the output voltage Vcx2.

When the input voltage Vi is input to the amplification unit 140, the NMOSFET 143 is turned on, and the NMOSFET 131 is also turned on, so that current flows through the resistor 142 between the drain and the source of the NMOSFET 143 and between the drain and the source of the NMOSFET 131, and output of the output voltage Vo of the amplification unit 140 is performed.

Here, a condition is desired under which the NMOSFET 131 of the resistance unit 130 is operated in a linear area. This is why on-resistance is changed for the gate voltage in the linear area.

Here, a first condition is desired under which the output voltage $V_{ct2}$ of the voltage square unit 120, which corresponds to the gate voltage of the NMOSFET 131 is threshold value voltage $V_{thn}$ or more of the NMOSFET 131, and a second condition is desired that the drain voltage Va of the NMOSFET 131 is over-drive voltage ($V_{ct2}-V_{thn}$) or less. That is, it is desirable that the following formulas (10) and (11) are satisfied.

$$V_{ct2} \geq V_{thn} \quad (10)$$

$$V_{ct2} - V_{thn} \geq Va \quad (11)$$

Here, $V_{thn}$ of the formulas (10) and (11) represents threshold value voltage of the NMOSFET 131, and Va represents drain voltage of the NMOSFET 131.

Therefore, the NMOSFET 131 may set a bias condition so that an initial state and a voltage range that satisfy the formulas (2) and (3).

As illustrated in FIG. 6E, the on-resistance $R_{on}$ of the NMOSFET 131 that is operated in the linear area is quadratically decreased so as to be inversely proportional to the quadratic function over time. The on-resistance $R_{on}$ is represented using the following formula (12).

$$R_{on} = 1/\gamma V_{ct2} = 1/\gamma\{RI_0 + R\beta(I_b/C)^2 t^2\} \quad (12)$$

Figure 6F:
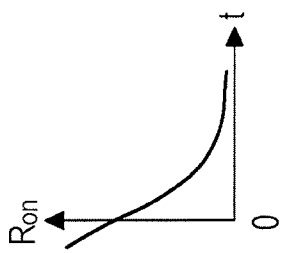

Therefore, the gain A of the amplification unit 140 ($=R_L/R_{on}$) is represented using the following formula (13), and as illustrated in FIG. 6F, the gain has a characteristic the value of which is quadratically increased over time.

$$A = RR_L\{I_0 + \beta(I_b/C)^2 t^2\}/\gamma \quad (13)$$

The gain characteristic of the gain control circuit 100 illustrated in FIG. 6A is described below with reference to FIGS. 7A and 7B.

Figure 7A:
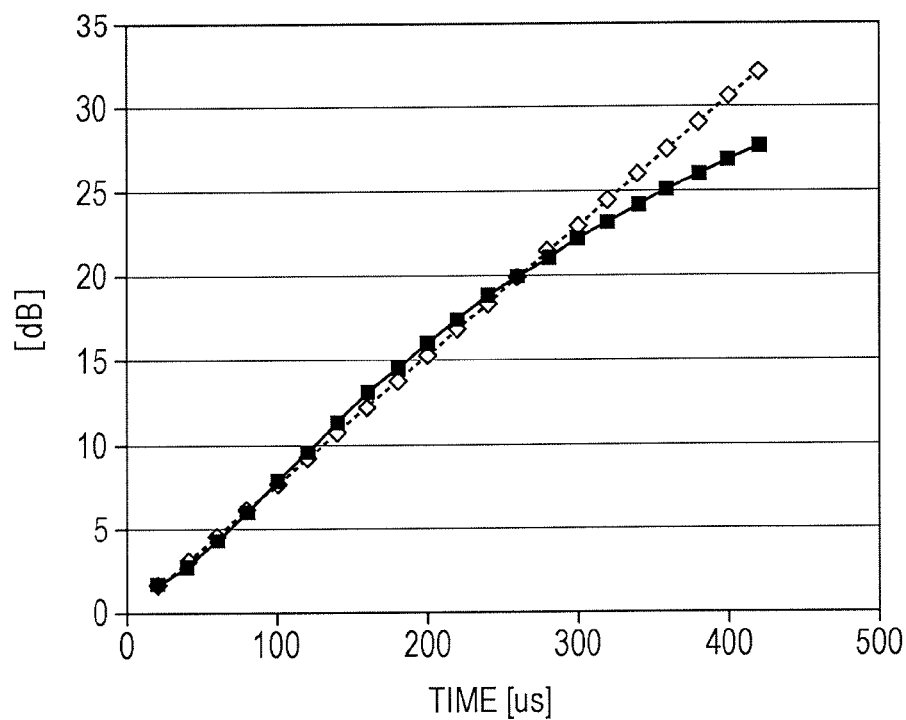
FIGS. 7A and 7B are diagrams illustrating gain characteristics of the gain control circuit illustrated in FIG. 6A.
Figure 7B:
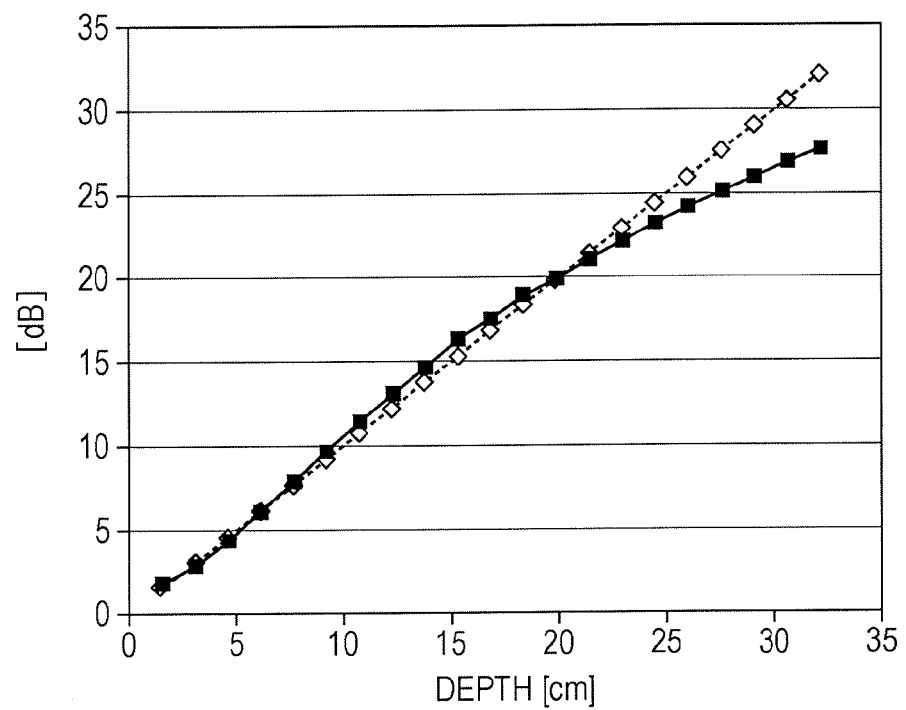

FIGS. 7A and 7B are diagrams illustrating the gain characteristics of the gain control circuit 100 illustrated in FIG. 6A.

The gain characteristic illustrated in FIGS. 7A and 7B are examples in which various parameters are adjusted based on the formula (5), and a TGC characteristic is reproduced.

First, an attenuation characteristic of ultrasonic waves in a living body that is to be reproduced by the TGC characteristic is obtained. The ultrasonic speed C is substantially invariable (C=1530 [m/s]) in the living body, and a time t that is taken until the ultrasonic waves are reflected at a portion that corresponds to the depth D and return to the transducer 10 after the ultrasonic waves are transmitted to the living body from the transducer 10 is obtained by "t=2D/C".

In addition, when a signal attenuation factor in the living body is set to 1 dB/(MHz·cm), an attenuation factor of ultrasonic waves having a frequency of 1 MHz is 1 dB/cm, and an attenuation amount Att for the time t [μs] is represented using the following formula (14).

$$Att = (1530 \times 10 - 4 \times t)/2 \quad (14)$$

When the attenuation amount Att for the time t is plotted based on the formula (14), the characteristic of the attenuation amount, which is indicated by the broken line by FIG. 7A, is obtained In addition, the gain characteristic that is obtained by substituting "$I_0$=100 [μA]", "R=900[Ω]", "$R_L$=1300[Ω]", "$I_b$=1 [μA]", "C=300 [pF]", "β=0.001", and "γ=0.01", into the formula (5), is illustrated by the solid line of FIG. 7A.

As illustrated in FIG. 7A, in a range approximating from "t=0 μs" to "t=300 μs", a value of the gain characteristic is equivalent to a value of the characteristic of the attenuation amount, and the time gain control characteristic is obtained.

In addition, there is some error due to the approximation after "t=300 μs", but such gain error is not a problem in the ultrasonic image device 500 because the beam-forming processing is executed in the receive beamformer 40.

In addition, in "t=300 μs", the gain compensation becomes small because the gain characteristic is saturated, but in theory, a signal is allowed to be received and processed in an area in which attenuation of a dynamic range or more in the ADC 330 that is provided downstream of the gain control circuit 100 (see FIG. 4) occurs.

FIG. 7B illustrates a gain characteristic and a characteristic of an attenuation amount when the horizontal axis (time) of FIG. 7A is changed into the depth. In a range in which the ideal gain compensation is obtained, the body depth approximately ranges from 0 cm to 20 cm, but there may be no problem practically.

As described above, in the gain control circuit 100 illustrated in FIGS. 4 to 7, the gain characteristic the value of which is quadratically increased over time may be obtained. Such a gain characteristic is an example of the time gain control characteristic, and has a log-linear characteristic as illustrated in FIGS. 7A and 7B as examples.

Thus, when an image of the human body is obtained in the ultrasonic image device 500 (see FIG. 4) that includes the gain control circuit 100, the following processing is executed. That is, even when ultrasonic waves are absorbed to the human body and attenuated as illustrated in FIG. 2A, display image frame signals having substantially invariable signal levels may be output from the receive beamformer 40, regardless of the depth, by controlling the signal gain of the reflected waves using the log-linear gain characteristic illustrated in FIGS. 7A and 7B.

As a result, the image processing device 400 may generate image signals having substantially invariable signal levels regardless of the depth.

As illustrated in FIGS. 4 to 6F, such a gain control circuit 100 does not include a DAC differently from the gain control circuit 1 (see FIG. 1), so that the downsizing may be performed.

For example, as illustrated in FIGS. 6A to 6F, the gain control circuit 100 in which the quadratic functional characteristic is obtained by using the PMOSFET 122 that is operated in the saturation region instead of the DAC 3A, the amplifier 2A, and the TGC amplifier 1A as illustrated in the gain control circuit 1 (see FIG. 1) to perform the downsizing.

In addition, an element having high power consumption as illustrated in the DAC 3A of the gain control circuit 1 (see FIG. 1) is not used, so that the power consumption of the gain control circuit 100 illustrated in FIGS. 4 to 7B may be decreased.

In addition, fewer materials when the gain control circuit 100 as a semiconductor device is manufactured are desired by achieving the downsizing in the gain control circuit 100 illustrated in FIGS. 4 to 7B, so that cost reduction may be achieved.

As described above, in the embodiments, the resistance unit 130 is included in the amplification unit 140 of the gain control circuit 100, but the resistance unit 130 and the amplification unit 140 are not limited to such a configuration.

For example, the gain A may be changed over time by using the amplification unit 140 such as the operational amplifier 1C illustrated in FIG. 3, and replacing the input resistor R1 or the feedback resistor R2 of the operational amplifier 1C with a resistor such as the resistance unit 130 the resistance value of which is changed over time.

Figure 8:
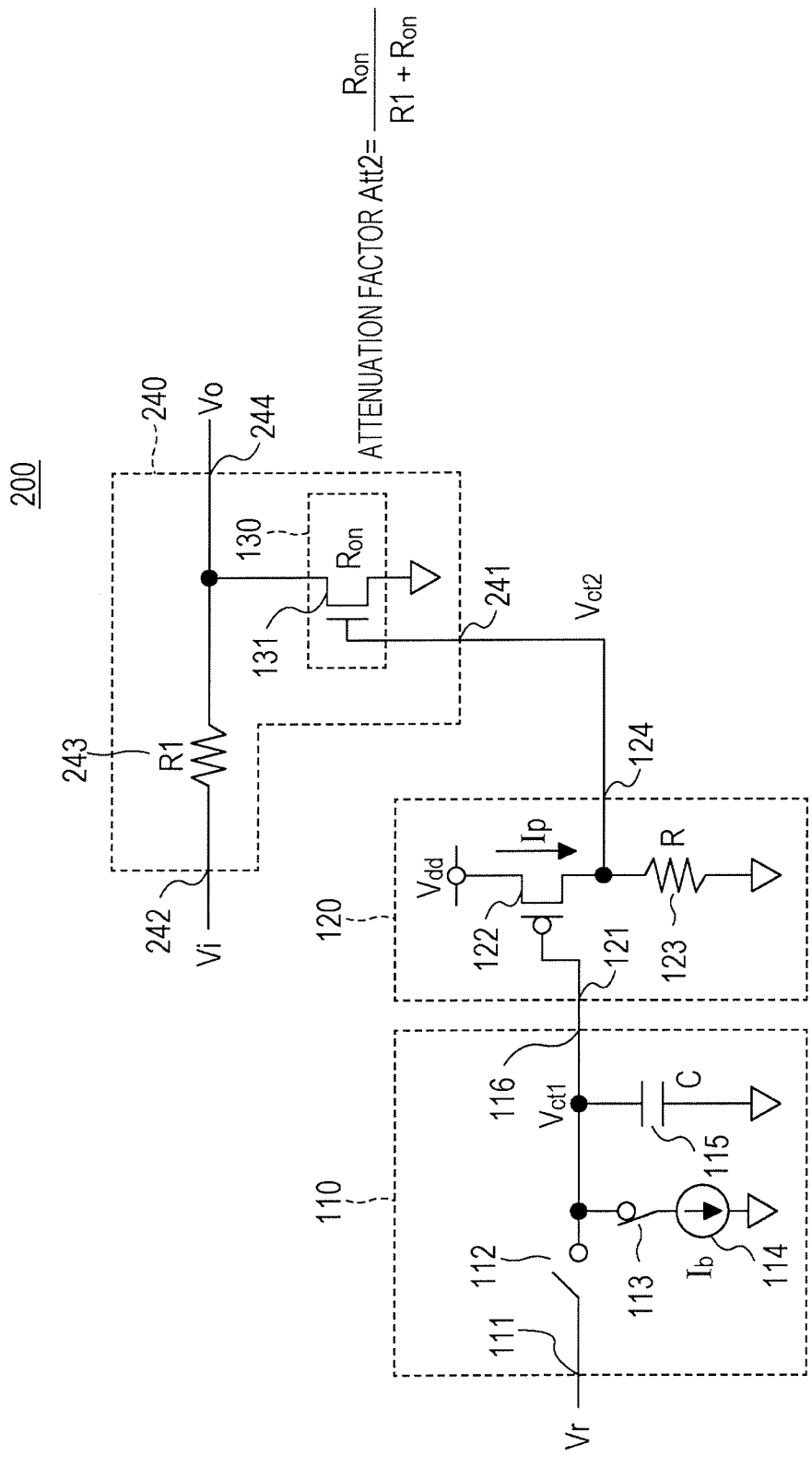
FIG. 8 is a diagram illustrating a circuit configuration example of a gain control circuit.

FIG. 8 is a diagram illustrating a circuit configuration example of the gain control circuit 200.

In the gain control circuit 200 illustrated in FIG. 8, the amplification unit 140 of the gain control circuit 100 illustrated in FIG. 6A is replaced with an amplification unit 240. Therefore, the configurations of the voltage generation unit 110, the voltage square unit 120, and the resistance unit 130 in the gain control circuit 200 is similar to the configurations in the gain control circuit 100 illustrated in FIGS. 4 to 7B, and the description is omitted herein.

The gain control circuit 200 includes the voltage generation unit 110, the voltage square unit 120, the resistance unit 130, and the amplification unit 240. In the gain control circuit 200, the resistance unit 130 is included in the amplification unit 240.

The amplification unit 240 includes an input section 241, a voltage input section 242, a resistor 243, and an output section 244. In addition, the amplification unit 240 includes the resistance unit 130. The amplification unit 240 is an example of a gain adjustment unit. Gain that the amplification unit 240 illustrated in FIGS. 8 to 9B assigns to signals is less than 1, so that the amplification unit 240 attenuates the signals by the amplification factor of less than 1. Therefore, the amplification unit 240 may be regarded as an attenuation unit.

The input section 241 is connected to the output section 124 of the voltage square unit 120 and the gate of the NMOSFET 131 of the resistance unit 130.

The input voltage Vi of the gain control circuit 200 is input to the voltage input section 242. That is, the voltage input section 242 is connected to the output section of the LNA 310 of the AFE 300 (see FIG. 4).

The resistor 243 is connected between the voltage input section 242 and the output section 244. In addition, the drain of the NMOSFET 131 of the resistance unit 130 is connected between the resistor 243 and the output section 244. The resistance value of the resistor 243 is represented as R1.

The output section 244 is connected to the resistor 243 and the drain of the NMOSFET 131 of the resistance unit 130. The output section 244 performs output of the output voltage Vo of the amplification unit 240. In addition, the output section 244 corresponds to an output section of the gain control circuit 200. Therefore, the output section 244 is connected to the input section of the LPF 320 of the AFE 300.

An attenuation factor Att2 of such an amplification unit 240 is represented using the following formula (14).

$$Att2 = R_{on}/(R1 + R_{on}) \quad (14)$$

That is, the attenuation factor Att2 of the amplification unit 240 is a value less than 1 and is an example of the gain of the gain control circuit 200. The gain control circuit 200 performs output of the output voltage Vo that is obtained by reducing the signal gain of the input voltage Vi by the attenuation factor Att2.

Here, when the formula (12) that indicates the on-resistance $R_{on}$ of the NMOSFET 131 of the resistance unit 130 is used (see FIGS. 4 to 7), the formula (14) that indicates the attenuation factor Att2 of the amplification unit 240 may be modified as represented in the following formula (15).

$$\text{The attenuation factor } Att2 = [1 + R1\gamma\{RI_0 + R\beta(I_b/C)^2 t^2\}]^{-1} \quad (15)$$

Therefore, a value of the attenuation factor Att2 of the amplification unit 240 is less than 1 and has a characteristic the value of which is decreased quadratically over time so as to be inversely proportional to the quadratic function.

As described above, in the gain control circuit 200 that has a gain characteristic by which the attenuation factor Att2 is less than 1 and the value of which is quadratically decreased over time so as to be inversely proportional to the quadratic function, for example, the amplification factor of the LNA 310 (see FIG. 4) that is located upstream of the gain control circuit 200 is significantly large, and the gain control circuit 200 may be used instead of the gain control circuit 100 illustrated in FIGS. 4 to 7 (see FIG. 4) when it is desirable that the signal gain of the output of the LNA 310 is attenuated.

The gain characteristic of the gain control circuit 200 illustrated in FIG. 8 is described below with reference to FIGS. 9A and 9B.

Figure 9A:
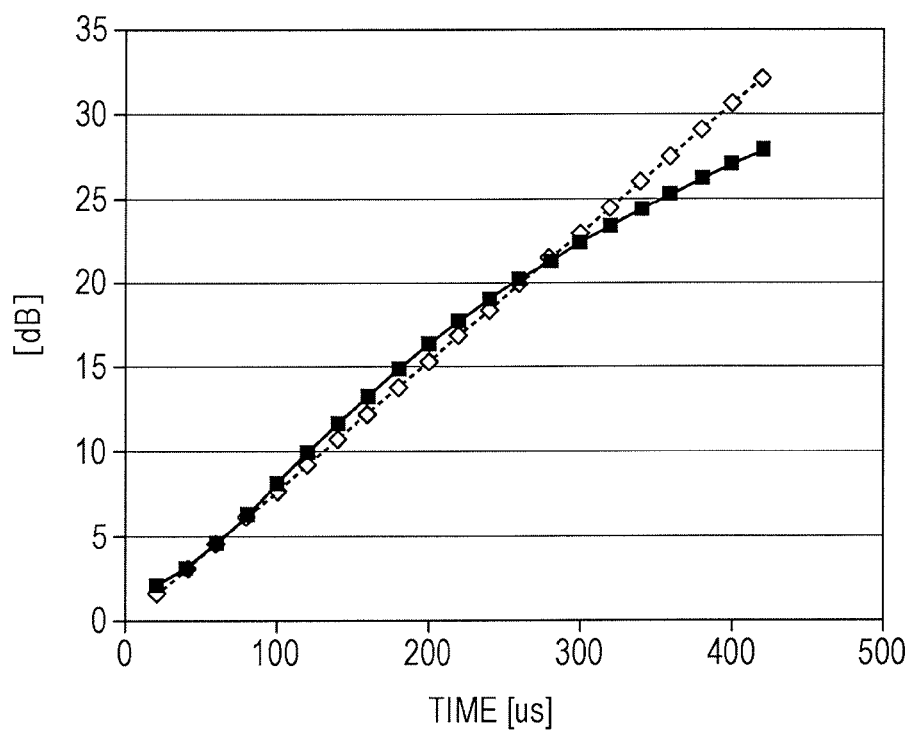
FIGS. 9A and 9B are diagrams illustrating gain characteristics of the gain control circuit illustrated in FIG. 8.
Figure 9B:
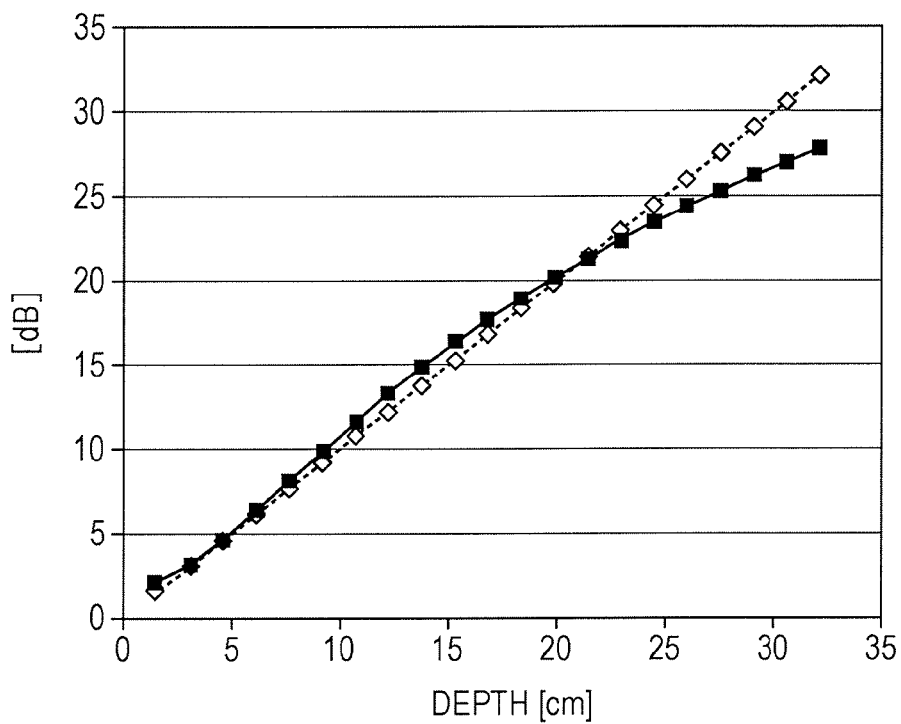

FIGS. 9A and 9B are diagrams illustrating the gain characteristics of the gain control circuit 200 illustrated in FIG. 8.

By the gain characteristic illustrated in FIGS. 9A and 9B, various parameters are adjusted based on the formula (15), and the gain characteristic indicate an attenuation amount of the signals level by the attenuation factor Att2 that is assigned by the formula (15).

The characteristic of an attenuation amount that is obtained by substituting "$I_0$=100 [μA]", "R=900[Ω]", "R1=250[Ω]", "$I_b$=1 [μA]", "C=130 [pF]", "β=0.001", and "γ=0.01" into the formula (15) is illustrated by the solid line in FIG. 9A. The characteristic that is illustrated by the broken line in FIG. 9A corresponds to the characteristic of the attenuation amount Att, which are represented using the formula (14) that is obtained in the embodiments that are related to FIGS. 4 to 7.

As illustrated in FIG. 9A, in a range approximating from "t=0 μs" to "t=300 μs", the value of the characteristic that indicates the attenuation amount of the attenuation factor Att2 is equivalent to the value of the characteristic of the attenuation amount Att. Therefore, the attenuation amount of the attenuation factor Att2, which is assigned by the formula (15), is a value such as the gain A that is obtained using the formula (5) in the embodiments that are related to FIGS. 4 to 7, and has the log-linear characteristic.

That is, when the amplification factor of the LNA 310 (see FIG. 4) that is located upstream of the gain control circuit 200 is significantly large, and it is desirable that signal gain of the output of the LNA 310 is attenuated, the signal gain of the output of the LNA 310 may be attenuated by a characteristic such as a reverse characteristic of the time gain control characteristic illustrated in FIGS. 4 to 7 using the gain control circuit 200 illustrated in FIGS. 8 to 9B.

In addition, there is some error due to the approximation after "t=300 μs", but in the ultrasonic image device 500, such error is not a problem because the beam-forming processing is executed in the receive beamformer 40.

In addition, in "t=300 μs", saturation of the characteristic of the attenuation amount occurs, but in theory, signals are allowed to be received and processed in an area in which attenuation of a dynamic range or more in the ADC 330 that is provided downstream of the gain control circuit 100 (see FIG. 4) occurs.

FIG. 9B illustrates a characteristic of an attenuation amount when the horizontal axis (time) of FIG. 9A is changed into the depth. In a range in which the ideal gain compensation is obtained, the body depth ranges about from 0 cm to 20 cm, but there may be no problem practically.

As described above, in the gain control circuit 200 illustrated in FIGS. 8 to 9B, the gain characteristic the value of which is quadratically decreased over time may be obtained. Such a gain characteristic corresponds to a characteristic such as the reverse characteristic of the time gain control characteristic and has the log-linear characteristic as illustrated in FIGS. 9A and 9B as an example.

Such a gain control circuit 200 does not include a DAC differently from the gain control circuit 1 (see FIG. 1), so that the downsizing may be achieved similar to the gain control circuit 200 illustrated in FIGS. 4 to 7.

In addition, an element having high power consumption is not used differently from the DAC 3A of the gain control circuit 1 (see FIG. 1), so that power consumption may be decreased in the gain control circuit 200 illustrated in FIGS. 8 to 9B.

In addition, fewer materials when the gain control circuit 200 illustrated in FIGS. 8 and 9 as a semiconductor device is manufactured are desired by achieving the downsizing in the gain control circuit 200, so that cost reduction may be achieved.

As described above, as examples of the embodiments, the gain control circuits and the ultrasonic image devices are described, but the embodiment are not limited to such examples that are discussed in detail herein, and variations and modifications are allowed to be made without departing from the scope of the appended claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A gain control circuit, comprising:
  a voltage generation circuit that generates a first voltage that is linearly changed over time, wherein the voltage generation circuit includes a capacitor one end of which is connected between an input section and an output section, and a current source that is connected between the input section and the output section so as to be parallel to the capacitor, and wherein the first voltage is output from the output section;
  a voltage square circuit that outputs a second voltage that is obtained by squaring the first voltage generated by the voltage generation circuit;
  a resistance circuit that has a resistance characteristic by which a resistance value is squared-changed over time depending on the second voltage output from the voltage square circuit; and
  a gain adjustment circuit in which gain is squared-changed over time depending on the resistance value of the resistance circuit.

2. A gain control circuit, comprising:
  a voltage generation circuit that generates a first voltage that is linearly changed over time;
  a voltage square circuit that outputs a second voltage that is obtained by squaring the first voltage generated by the voltage generation circuit, wherein the voltage square circuit includes a first transistor that is connected between a power source and a reference potential point; that is connected to the output section of the voltage generation circuit via a control terminal of the first transistor; and that outputs the second voltage obtained by squaring the first voltage by being driven in a saturation region;
  a resistance circuit that has a resistance characteristic by which a resistance value is squared-changed over time depending on the second voltage output from the voltage square circuit; and
  a gain adjustment circuit in which gain is squared-changed over time depending on the resistance value of the resistance circuit.

3. The gain control circuit according to claim 2, wherein the resistance circuit includes a second transistor that is connected to an output section of the voltage square circuit via a control terminal of the second transistor, and that has a resistance characteristic by which a resistance value is squared-changed over time by receiving the second voltage from the voltage square circuit via the control terminal.

4. The gain control circuit according to claim 1, wherein the gain adjustment circuit includes a first resistor and adjusts gain based on a ratio of a resistance value of the resistance circuit to a resistance value of the first resistor.

5. The gain control circuit according to claim 1, wherein the gain adjustment circuit adjusts the gain such that the gain is inversely proportional to a quadratic function over time depending on the resistance value of the resistance circuit.

6. An ultrasonic image device, comprising:
  a conversion circuit that outputs ultrasonic waves and converts received waves reflected by a target object into voltage signals;

a gain control circuit that controls gain of the voltage signals output from the conversion circuit; and an image processor that executes image processing based on the voltage signals the gain of which is controlled by the gain control circuit, wherein the gain control circuit includes:

a voltage generation circuit that generates a first voltage that is linearly changed over time, wherein the voltage generation circuit includes a capacitor one end of which is connected between an input section and an output section, and a current source that is connected between the input section and the output section so as to be parallel to the capacitor, and wherein the first voltage is output from the output section;

a voltage square circuit that outputs a second voltage that is obtained by squaring the first voltage generated by the voltage generation circuit;

a resistance circuit that has a resistance characteristic by which a resistance value is squared-changed over time depending on the second voltage output from the voltage square circuit; and a gain adjustment circuit in which gain is squared-changed over time depending on the resistance value of the resistance circuit.

* * * * *